United States Patent
Hidai et al.

[11] Patent Number: 6,094,404
[45] Date of Patent: Jul. 25, 2000

[54] DISPLAY STRUCTURE WITH SOLAR CELL, AND ELECTRONIC DEVICES AND TIMEPIECE POWERED BY SOLAR CELL

[75] Inventors: Yoshihiro Hidai; Noriaki Sugiyama, both of Suwa, Japan

[73] Assignee: Seiko Epson Corporation, Tokyo, Japan

[21] Appl. No.: 08/930,552

[22] PCT Filed: Jan. 21, 1997

[86] PCT No.: PCT/JP97/00119

§ 371 Date: Aug. 24, 1998

§ 102(e) Date: Aug. 24, 1998

[87] PCT Pub. No.: WO97/27520

PCT Pub. Date: Jul. 31, 1997

[30] Foreign Application Priority Data

Jan. 23, 1996 [JP] Japan ................................. 8-009279

[51] Int. Cl.[7] .............. G04B 1/00; G04C 3/00; H01L 31/06
[52] U.S. Cl. .......................... 368/205; 368/223; 136/257
[58] Field of Search ...................... 368/66, 88, 203–205, 368/223, 228; 136/246, 257, 256, 251; 428/141, 701; 429/111

[56] References Cited

U.S. PATENT DOCUMENTS

| 4,392,006 | 7/1983 | Apelian . | |
|---|---|---|---|
| 4,629,821 | 12/1986 | Bronstein-Bentz et al. | 136/257 |
| 5,714,012 | 2/1998 | Murata et al. | 136/247 |

FOREIGN PATENT DOCUMENTS

| 0 242 088 | 10/1987 | European Pat. Off. . |
| 0 680 097 | 11/1995 | European Pat. Off. . |
| 55-94587 | 6/1980 | Japan . |
| 62-3092 | 9/1987 | Japan . |
| 5-294667 | 2/1993 | Japan . |
| 5-45474 | 2/1993 | Japan . |
| 7-198866 | 1/1995 | Japan . |
| 7-287541 | 10/1995 | Japan . |
| 7-294667 | 11/1995 | Japan . |

Primary Examiner—Vit Miska
Attorney, Agent, or Firm—Stroock & Stroock & Lavan

[57] ABSTRACT

The present invention provides a solar-battery-mounted display structure which comprises a solar battery (16) having a light-receiving surface (16a) disposed in a displaying portion, a light-transmissive plate (17) disposed on the front side of the light-receiving surface and having a predetermined light-transmittance, and an coating layer (20) formed on the back surface of the light-transmissive plate such that the solar battery can securely generate at least a predetermined amount of electric power. Since an coating layer is formed on the back surface of the light-transmissive plate, no coating layer is necessary on the light-receiving surface of the solar battery. Due to this, consideration of suitability of such a coating layer to the light-receiving surface is not required, and discarding or exchange of the solar battery due to defects in such a coating layer is not required. Moreover, since the coating layer is formed on the back surface of the light-transmissive plate, the incident plane of extrinsic light equals the smooth adhering surface of the coating layer onto the light-transmissive plate. Accordingly, the amount of reflected light or scattered light derived from extrinsic incident light can be reduced, and therefore, the efficiency of utilizing extrinsic light can be improved. In addition, generation of interference fringes (Newton rings) can be prevented by the coating layer formed on the back surface of the light-transmissive plate.

25 Claims, 11 Drawing Sheets

DISPLAY STRUCTURE WITH SOLAR CELL, AND ELECTRONIC DEVICES AND TIMEPIECE POWERED BY SOLAR CELL

FIELD OF THE INVENTION

The present invention relates to a structure for a display unit with a solar battery, and a solar-battery-mounted electronic apparatus and a solar-battery-mounted watch using such a solar-battery-mounted display structure. More particularly, the present invention relates to a display structure suitable to a case where a dial of a watch is made to serve as a light-receiving surface of a solar battery.

BACKGROUND OF THE INVENTION

Hitherto, for example, in an apparatus in which at least a part of the displaying functions of its display unit is operated by photoelectrically generated power, a light-receiving surface of a solar battery is disposed on a part of or the entire displaying surface formed in the display unit, and electric power is generated from light incident on the light-receiving surface. Among such apparatuses, a typical example is a watch in which a light-receiving surface of a solar battery is disposed instead of a part of or the entire dial. In such a watch, since a light-receiving surface of a solar battery is placed in the position which should be a surface of its dial, another light-receiving surface in a position other than the displaying surface is not required, the space for the light-receiving surface can be saved, and therefore, even a small watch can contain a solar battery which has a power-generating ability sufficiently coping with the electric power demanded from its clocking function.

In early solar-battery-mounted watches, however, since the light-receiving surface of the solar-battery was exposed to the displaying surface where a dial should originally be disposed, the appearance of the displaying surface was unsatisfactory, and achieving a fancy design was difficult. FIG. 12 is a plan view of an example of a solar battery mounted in such a watch. On the surface of the solar battery 72, a light-receiving surface 72$a$ is formed which has a planar pattern comprising four partitions 72$a$-1, 72$a$-2, 72$a$-3 and 72$a$-4 separated by gapping portions 72$a$-0. Here, the gapping portions 72$a$-0 ordinarily have a light color tone, and partitions 72$a$-1, 72$a$-2, 72$a$-3 and 72$a$-4 ordinarily have a dark color tone. Accordingly, such a separated pattern gives a markedly strange impression for the displaying surface, and is disadvantageous in view of design. In particular, although characters and decorative parts are desired to be added onto the dial of a watch by printing, sticking or other methods, such characters and decorative parts could rarely be directly formed on the light-receiving surface 72$a$ of the solar battery.

Upon this, hitherto, as shown in FIG. 13, a technique was offered in which a translucent coating layer 73 is formed on a light-receiving surface 72$a$, and the displaying surface can thereby possess an appearance with a predetermined color tone. Such a technique is disclosed, for example, in Japanese Unexamined Utility Model Publication No. 5-93057 and others. Inside the body case 70 (trunk) of a watch, a dial holding ring 71 and a dial ring 74 are fixed, and a solar battery 72 is fixed between the dial holding ring 71 and the dial ring 74. A coating layer 73 is formed on the light-receiving surface 72$a$ of the solar battery 72, and the surface of the coating layer 73 serves as a dial surface of an ordinary watch. Incidentally, a hands/wheels portion 75 protrudes to the front surface through a wheel hole formed at the center of the solar battery 72, and a cover glass 76 fixed to the body case 70 is disposed above the hands/wheels portion 75.

The coating layer 73 is formed as a light-transmissive layer having a predetermined transmittance, or a scattering layer having a predetermined wavelength-selective scattering property. In this case, since a part of light is reflected or scattered in the coating layer 73 and the remaining transmitted light which reaches the light-receiving surface 72$a$ is used for power generation in the solar battery, it is an important point to adjust the optical properties of the coating layer 73 to desired levels. In such a structure, the light-receiving surface 72$a$ can be protected by the coating layer 73 while securing the power-generating function of the solar battery, and the coating layer 73 can give the displaying surface an appearance with a predetermined color tone, characters, decorative parts and the like.

In the above-described solar-battery-mounted watch, when the light transmittance of the coating layer 73 is high, the dark partitions 72$a$-1, 72$a$-2, 72$a$-3 and 72$a$-4 of the solar-buttery light-receiving surface 72$a$ having a planar pattern as shown in FIG. 12 can be seen through the layer in the shapes separated by the light gapping portions 72$a$-0 which are formed between the partitions. As a result, the appearance of the displaying surface is poor. In contrast, when the light-transmittance of the coating layer 73 is low, the amount of light reaching the light-receiving surface 72$a$ of the solar battery is lowered, and the generated electric power is reduced to cause problems in the operation of the watch. Accordingly, the optical properties of the coating layer 73 should be adjusted such that the displaying surface has an appearance with a predetermined color tone and the like while achieving a light transmittance at a degree needed to secure power generation by the solar battery. Ordinarily, the thickness and material of the coating layer 73 should be appropriately selected and-adjusted in order to achieve desired optical properties of the coating layer. It is, however, extremely difficult to select materials satisfying the above requirements from among materials which can be applied onto the light-receiving surface 72$a$ of the solar battery, and therefore, the restriction on the color tone and design cannot sufficiently removed. Further, in this case, since such an additional coating layer 73 must be deposited on the light-receiving surface 72$a$ of the solar battery according to a physical or chemical method, the manufacturing costs are increased. Moreover, if the coating layer 73 formed on the solar battery 72 has a defect or is damaged afterward, the resultant must be discarded together with the expensive solar battery 72.

Meanwhile, Japanese Unexamined Patent Publication No. 7-72266 and others have disclosed some methods in which a transparent or translucent plate (hereinafter referred to as light-transmissive plate) such as a resin plate, a ceramic plate or a marble plate is disposed on the light-receiving surface of a solar battery. According to such a method, the manufacturing cost can be lowered as compared to a method in which a coating layer is directly formed on the light-receiving surface of a solar battery, and desired characters and decorative parts can be provided on the front surface of the light-transmissive plate by printing or the like. In such a case where a light-transmissive plate is disposed on the light-receiving surface, consideration for suitability of the coating layer to the light-receiving surface of the solar battery, which is required in the above-mentioned example, is not especially required. Nevertheless, similar to the above, the light transmittance of the light-transmissive plate must be precisely controlled by selecting the thickness and material in order to improve the appearance of the displaying surface and secure sufficient electric power generation. In this case, if the material for the light-transmissive plate is selected in view of appearance only, the thickness of the plate tends to be excessively thin to make the assembling work difficult, or the light-transmissive plate tends to suffer from deformation such as bending even after being assembled. Furthermore, when the light transmittance of the light-transmissive plate is relatively high, interference fringes are generated due to surface reflection between the light-receiving surface of the solar battery and the light-transmissive plate, and the appearance of the watch is thereby spoiled. In particular, even though the design of the displaying surface is expressly satisfactorily improved by providing a light-transmissive plate, the quality of the product may be doubted due to the presence of interference fringes.

The present invention is directed to solution of the above-described problems, and an object of the invention is to provide a solar-battery-mounted display structure in which the light-receiving surface of the solar battery is disposed on a displaying surface, wherein the appearance of the displaying surface can be improved, the power-generating capacity of the solar battery can be relatively readily secured, and the display structure can be easily manufactured. Further, the present invention provides a display structure which is free from interference-fringe generation by the light-receiving surface of the solar battery and a coating layer or a light-transmissive plate. Moreover, in the present invention, prevention of interference-fringe generation is achieved according to an easy and manufacturing-cost-saving method. In particular, the subjects to which the solar-battery-mounted display structure is applied are solar-battery-mounted electronic apparatuses and solar-battery-mounted watches as the quality of their displaying portions can be improved and their sizes can be reduced.

SUMMARY OF THE INVENTION

An aspect of the present invention is a solar-battery-mounted display structure comprising a solar battery which has a light-receiving surface disposed in a displaying portion, a light-transmissive plate which has a predetermined light-transmittance and is disposed on the front side of said light-receiving surface, and a coating layer formed on the back surface of said light-transmissive plate, wherein said light-transmissive plate and said coating layer are formed so as to achieve light-transmitting properties which at least secure a predetermined power-generating capacity of said solar battery.

According to this means, since such a coating layer is formed on the back surface of the light-transmissive plate, no coating layer is necessary on the light-receiving surface of the solar, battery. Due to this, consideration of suitability of such a coating layer to the light-receiving surface is not required, and discarding or exchange of the solar battery due to defects in such a coating layer is not required.

Further, the appearance of the light-transmissive plate, such as the color tone, the pattern and characters can be arranged according to the combination of the plate and the coating layer, and the degree of freedom in selection of the material and thickness of the light-transmissive plate can be improved by adjusting the area, the thickness and the like of the coating layer.

Moreover, since the coating layer is formed on the back surface of the light-transmissive plate, the incident plane of extrinsic light equals the surface of the coating layer onto the light-transmissive plate. Since the adhering surface is smoothed by the back surface of the light-transmissive plate, the amount of reflected light or scattered light derived from extrinsic incident light can be reduced, and therefore, the efficiency of utilizing extrinsic light can be improved.

In addition, generation of interference fringes (Newton rings) between the light-transmissive plate and the light-receiving surface of the solar battery can be prevented by the coating layer formed on the back surface of the light-transmissive plate.

Furthermore, since the light-receiving surface and the back surface of the light-transmissive plate can be fixed in a state where these are directly laminated, the part structures can be simplified, assembly can be made easy, and therefore, manufacturing costs can be reduced. Additionally, if the light-transmissive plate is put into direct contact with the light-receiving surface of the solar battery, the back surface of the light-transmissive plate and the light-receiving surface of the solar battery are rarely damaged due to the coating layer formed as a buffering layer. Moreover, even if the surface of the coating layer or the light-receiving surface of the solar battery is damaged or stained, such damages or stains can rarely be seen from the front side.

Here, the coating layer is preferably formed with a material containing a light-emitting substance.

According to this manner, since the coating layer is formed with a material containing a light-emitting substance, light is emitted from the coating layer even in a place without illumination during the night, and therefore, the displaying portion can be visibly recognized. In particular, when the coating layer provides a special indication, pattern or the like for the displaying surface, such an indication, pattern or the like can be directly visibly recognized due to the light emission.

Incidentally, various light-emitting substances of various light-emitting properties, such as fluorescent substances, phosphorescent substances, luminous materials and radioactive materials, can be used regardless of whether they have self-light-emitting properties or not. So-called light-accumulating fluorescent substances (light-accumulating substances), which can emit afterglow for long time periods, are preferred among such light-emitting substances. Particularly preferred are light-accumulating substances which include, as mother crystals, compounds comprising $MAl_2O_4$ (M is at least one metallic element selected from the group consisting of calcium, strontium and barium), since such compounds can emit afterglow for long time periods, are chemically stable, and have superior lightfastness lasting for long time periods.

Further, in this case, the coating layer is preferably formed by depositing fine particles of such a fluorescent substance.

According to this manner in which the coating layer is formed by depositing fine particles of a fluorescent substance, the surface of the coating layer can be uneven in accordance with particle sizes of the fine particles. As a result, reflected light from the light-receiving surface can be scattered and confined within the back side from the coating layer, the final amount of light received by the solar battery can be thereby increased, and the planar pattern of the light-receiving surface of the solar battery can rarely be recognized through the outside.

Incidentally, the deposition of fine particles can be employed not only for forming a coating layer containing a fluorescent substance, but also for roughening the surface of the coating layer, as described below.

In each of the above-described cases, a gap should be preferably provided between the light-transmissive plate and the light-receiving surface of the solar battery.

According to this manner in which a gap is provided between the coating layer and the light-receiving surface, a light-confinement effect can be obtained due to irregular reflection between the surface of the coating layer and the light-receiving surface, and therefore, the entire efficiency of light-utilization can be improved. Further, since the visibility of the light-receiving surface structure through the light-transmissive plate can be reduced by providing such a gap, the appearance of the displaying surface can be maintained at a satisfactory level even if the light-transmittances of the light-transmissive plate and the coating layer are raised.

Additionally, the surface of the coating layer should preferably be roughened.

According to this manner in which the surface of the coating layer is roughened, light passing through the coating layer and reflected on the light-receiving surface is scattered on the roughened surface of the coating layer, finally absorbed on the light-receiving surface without re-emitted outside, and subjected to electric power generation. As a result, the efficiency of light utilization can be raised, and the planar pattern of the light-receiving surface of the solar battery can rarely be seen from the outside.

Moreover, a displaying window which is formed by providing a coating-layer-unformed area in the light-transmissive plate, and an opening which is formed in a solar battery in a position corresponding to the displaying window should preferably be provided such that the structural parts behind the opening can be visibly recognized through the displaying window.

According to this manner, since the structural parts behind the opening in the solar battery can be visibly recognized through the displaying window comprising the coating-layer-unformed area, several information-displaying members can be disposed behind the solar battery while the information is displayed, and such information-displaying members can be protected by the displaying window formed with the light-transmissive plate itself without providing another protective window or the like.

Furthermore, the coating layer is preferably formed on the back surface of the light-transmissive plate in a selective planar pattern.

According to this manner in which the coating layer is formed on the back surface of the light-transmissive plate in a selective planar pattern, various patterns in accordance with the planar pattern can be provided on the displaying surface.

In this case, further preferably, the coating layer is formed thicker than the wavelengths of the visible light beams, and put into contact with the light-receiving surface of the solar battery, thus providing a gap in accordance with the thickness of the coating layer between the light-receiving surface of the solar battery and the back surface of the light-transmissive plate where the coating layer is not formed.

According to this manner in which the coating layer is formed thicker than the wavelengths of the visible light beams, since a gap sufficiently wider than the wavelengths of the visible light beams can be formed between the light-transmissive plate and the light-receiving surface, generation of interference fringes (Newton rings) due to light reflection between the light-receiving surface and the coating-layer-unformed area on the back surface of the light-transmissive can be prevented. Further, since the light-receiving surface and the back surface of the light-transmissive plate can be fixed while both the surfaces are directly laminated, the part structures can be simplified and assembly can be made easy, and therefore, the manufacturing cost can be reduced.

Moreover, the coating layer is preferably formed in a region corresponding to the position where at least one of the solar battery and the light-transmissive plate is press-fixed with other members.

According to this manner- in which the coating layer is formed, for example, in a watch, in the position where the solar battery and/or the light-transmissive plate are press-fixed with a dial holding ring, a dial ring or the like, since the gap between the solar battery and the light-transmissive plate can be securely specified based on the thickness of the coating layer, generation of interference rings as described above and loose assembly of parts can be inhibited. Additionally, since the coating layer serves as a buffering layer for the press-fixed portion, the light-receiving surface and the light-transmissive plate can be prevented from being damaged or deformed.

Further, the coating layer preferably has a color distribution, a thickness distribution and/or a planar pattern which can negate the visible planar pattern on the light-receiving surface of the solar battery.

According to this manner, since the color distribution, the thickness distribution and the planar pattern of the coating layer can negate the pattern in the structure of the light-receiving portion of the solar battery, the structure of the light-receiving portion of the solar battery cannot be seen through the displaying portion. As a result, the quality of the design can be improved, and the degree of freedom in designing the displaying surface can be raised regardless of the structure of the light-receiving portion. In particular, since the coating layer is formed so as to negate the pattern derived from the structure of the light-receiving portion, the light-transmittance of the entire light-transmissive plate including the coating layer can be improved, and the power-generating capacity of the solar battery can be increased.

Next, as to the solar-battery-mounted electronic apparatus, it comprises the above-described solar-battery-mounted display structure, and is at least partially put into operation by electric power generated in the solar battery.

Here, a displaying window which is formed by providing a coating-layer-unformed area in the light-transmissive plate, an opening which is formed in a solar battery in a position corresponding to the displaying window, and an information-displaying portion disposed behind the opening should preferably be provided such that the information-displaying portion can be visibly recognized through the displaying window.

Next, as to the solar-battery-mounted watch, it comprises the above-described solar-battery-mounted display structure, and is put into operation at least partially by electric power generated in the solar battery.

Here, the light-transmissive plate may be formed as a dial for time indication.

In this case, the light-transmissive plate can be made to serve as a dial for time indication by forming characters, graphics and other patterns on the light-transmissive plate according to printing, stamping or other methods.

Further, a displaying window which-is formed by providing a coating-layer-unformed area in the light-transmissive plate, an opening which is formed in a solar battery in a position corresponding to the displaying window, and an information-displaying portion disposed behind the opening should preferably be provided such that the information-displaying portion can be visibly recognized through the displaying window.

Moreover, the time-indicating patterns or characters on the displaying surface should preferably be formed based on a color distribution, a thickness distribution and/or a planar pattern of the coating layer.

According to this manner, since the time-indicating patterns or characters, i.e. time-indicating scales, numbers or the like, can be formed with the coating layer, the coating layer provides patterns for the dial as well as a structure preventive against interference fringes.

DETAILED DESCRIPTION OF THE PREFERRED EMBODIMENTS

Embodiments according to the present invention will be illustrated with reference to the attached drawings. Although watches in which the light-receiving surfaces of the solar batteries are disposed for the displaying surfaces are illustrated in the below-described embodiments, the solar-battery-mounted display structure of the present invention can also be adopted for the displaying portions of various products in which the light-receiving surfaces of the solar batteries are disposed for the displaying surfaces. Without being limited to the watches in the below-described embodiments, the present invention can be widely used for various products and parts having displaying portions (portions displaying or indicating some information) so long as such a displaying portion is provided with a light-receiving surface of a solar battery. Examples of such products include electronic equipment such as pocket calculators, mobile cellular phones, pagers and portable radios, electronic clocks, wrist watches and table clocks, and the present invention is especially effective in miniaturizing such equipment and making it portable.

Figure 1:
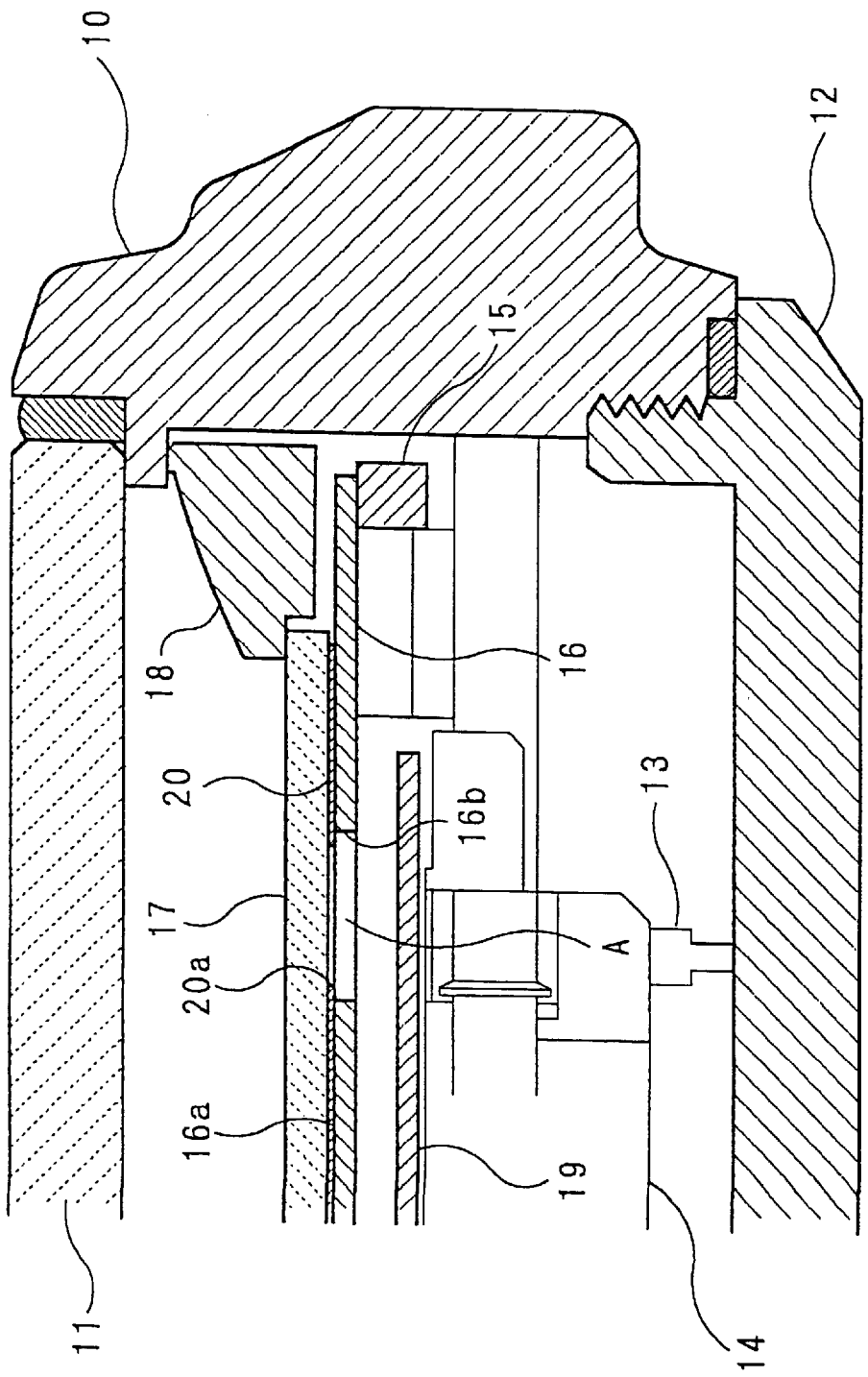
FIG. 1 is an enlarged sectional view in the direction of 3 o'clock, showing a part of the solar-battery-mounted watch of Embodiment 1 according to the present invention, omitting the illustration of its crown.

FIG. 1 is a sectional view partially showing the body of a solar-battery-mounted watch of Embodiment 1 according to the present invention, wherein the section faces the direction of 3 o'clock (the direction indicated by the hour hand at 3 o'clock). Here, the shape of a crown is omitted for illustration. In this watch, a cover glass 11 is placed on the front side of a body case 10, and a rear cover 12 is provided on the back side of the body case 10. Inside the body case 10, a watch movement 14 is included and is held by a protruding part 13. This watch movement 14 is a device to drive the hands having the function of indicating time.

In the body case 10, a dial holding ring 15 made of a synthetic resin is fixed on the front side of the watch movement 14. On the dial holding ring 15, the peripheral portion of a solar battery 16 having the shape of a wafer is mounted.

As to the structure of the solar battery 16, various structures publicly-known as solar battery structures can be employed. A most typical solar battery structure for a watch comprises a semiconductor having a p-i-n structure, and a transparent electrode film formed with ITO (indium-tin oxide) or the like on the front surface of the semiconductor, wherein the p-i-n structure is formed by forming an amorphous silicon layer according to chemical vapor deposition on a substrate which comprises a thin stainless steel plate and also serves as an elect-rode plate.

The semiconductor layer of the solar battery 16 is formed, for example, as follows using a plasma chemical-vapor-deposition apparatus: Initially, $SiH_4$ gas is fed into a chamber while adding a slight amount of $PH_3$ gas, and a p-type silicon layer is formed; next, $SiH_4$ gas is fed without a dopant, and an i-type silicon layer is formed; and finally, $SiH_4$ gas is fed into a chamber while adding $B_2H_6$ gas, and a n-type silicon layer is formed.

A light-transmissive plate 17 comprising an acrylic resin plate of 0.5 mm thickness is disposed on the front surface of the solar battery 16 (the upper side in FIG. 1), namely, in the front of a light-receiving surface 16a. The light-transmissive plate 17 may comprise glass, a sheet of a resin such as an acrylic resin or a polycarbonate resin, or the like. The light-transmissive plate 17 does not necessarily have to be transparent so long as it exhibits transmittance of light onto the light-receiving surface 16a of the solar battery 16 at a degree for securing electric power generation needed to operate the watch. Since the peripheral portion of the light-transmissive plate 17 is pressed with a circular dial ring 18 from the front side, the solar battery 16 and the light-transmissive plate 17 are fixed while being sandwiched between the dial holding ring 15 and the dial ring 18.

In general, acrylic resins, which can be used as a material for the light-transmissive plate 17 in this embodiment, contain ultraviolet absorbent, and therefore absorb and do not transmit ultraviolet rays. In contrast, polycarbonate resins generally do not absorb ultraviolet rays. Accordingly, if a polycarbonate resin is used for the light-transmissive plate and a coating layer comprising a light-accumulating fluorescent substance is formed on the back surface of the light-transmissive plate, as described below, the displaying surface brightly glows due to the radiation of an ultraviolet ray from an ultraviolet light when being exhibited. Further advantageously, since polycarbonate resins are thermostable and can be subjected to a heat treatment at approximately 120° C., the below-described heat treatment for a light-accumulating fluorescent substance can be easily carried out.

On the back surface of the light-transmissive plate 17, a coating layer 20 is provided by application or printing under predetermined conditions. The coating layer 20 is formed with an organic coating material or the like so as to adhere to the back surface of the light-transmissive plate 17 at a predetermined thickness and area, and is thereby given semi-light-transmissive properties. Light-transmissive properties are appropriately determined according to the thickness, the area and the material of the coating layer 20. More specifically, the power-generating capacity of the solar battery 16 sufficient for driving the watch movement 14 is calculated beforehand, the thickness and the area of the coating layer 20 necessary for obtaining the calculated power-generating capacity are then determined depending on the material, and the coating layer 20 is formed in accordance with the thus-determined thickness and area.

Other than by applying or printing an ordinary coating material, the coating layer 20 may be formed by adhesion of a light-transmissive oxide layer according to vapor deposition or sputtering, or by bonding an organic resin sheet to the back surface of the light-transmissive plate 17.

Further, a thin-film comprising a luminous substance, especially a light-accumulating fluorescent substance, is preferably used as a material for the coating layer 20. Among various luminous substances, so-called light-accumulating fluorescent substances (light-accumulating materials) can emit visibly-recognizable afterglow for a fairly long time (a few tens of minutes to a few hours) even after extrinsic stimulation is stopped. Examples of light-accumulating fluorescent substances include sulfide fluorescent substances such as CaS:Bi (CaS with the addition of Bi, purplish-blue luminescent color), CASrS:Bi (blue luminescent color), ZnS:Cu (green luminescent color), and ZnCdS:Cu (yellow to orange luminescent-color).

Rather than these fluorescent substances, materials which include, as mother crystals, compounds comprising $MAl_2O_4$ (M is at least one metallic element selected from the group consisting of calcium, strontium and barium) are preferred since they can emit afterglow for long time periods and have high weatherability and lightfastness.

To the mother crystals of light-accumulating fluorescent substances having the $MAl_2O_4$ structure, magnesium may be added as occasion demands. Additionally, 0.001 mol % to 10% of europium may be added as an activator. In this case, 0.001 mol % to 10% of at least one of lanthanum, cerium, praseodymium, neodymium, samarium, gadolinium, terbium, dysprosium, holmium, erbium, thulium, ytterbium, lutetium, manganese, tin, and bismuth may further be added as a coactivator.

Such mother crystals are ground into fine particles, the ground particles are mixed with an organic binder, a solvent or the like, and made to adhere to the back surface of the light-transmissive plate 17 by application or printing (such as screen-printing). After adhesion, a heat treatment at a predetermined temperature (for example, at 80 to 100° C. for 1 to 2 hours) is carried out to form a coating layer 20.

In a case where strontium-alumina is used as a light-accumulating fluorescent substance, for-example, the average diameter of the ground particles is adjusted at 15 to 20 $\mu$m, and the coating layer 20 is formed so as to have a thickness of approximately 80 to 150 $\mu$m. According to this, the light-transmittance of the light-transmissive plate 17 can be adjusted to a predetermined degree, and the power-generating efficiency of the solar battery can be approximately 45 to 60% of that in the case where the light-receiving surface 16a is uncovered. In a watch which contains a solar battery 16 having a light-receiving area of approximately 200 mm² or more and has a displaying surface substantially entirely used for a light-receiving surface 16a, an electronic watch movement using an ordinary quartz oscillator can be sufficiently and practically driven with the power-generating efficiency of such a level.

In this embodiment, an unformed region 20a where the coating layer 20 is deficient is formed on the displaying surface, and an opening 16b in the solar battery 16 is disposed beneath the unformed region 20a. According to this structure, a date window A is formed. A date dial 19 is disposed under the date window A, and date indication on the front surface of the date dial 19 can be visibly recognized through the light-transmissive plate 17.

Figure 6:
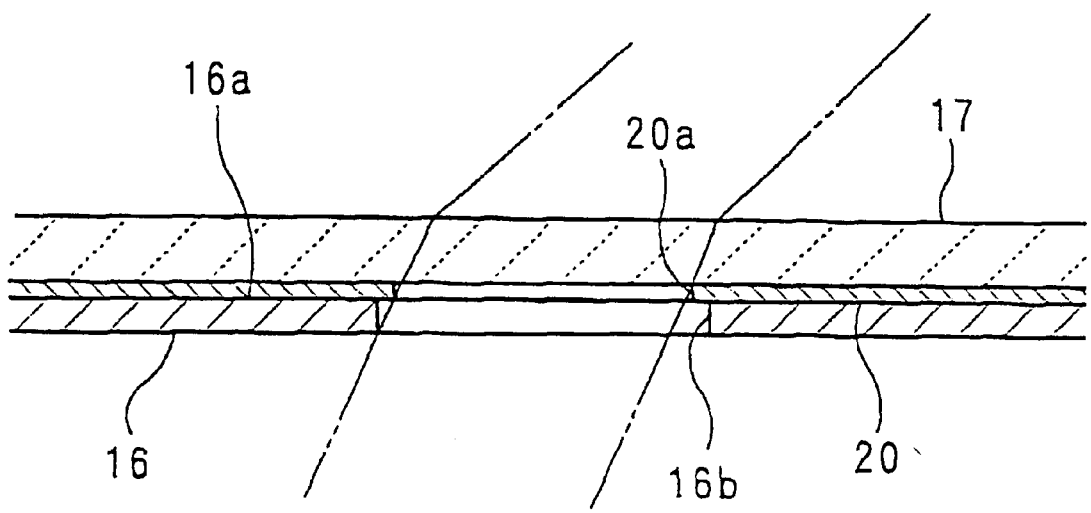
FIG. 6 is an enlarged sectional view showing the structure around a date window in the first embodiment.

In this case, since the coating layer 20 adheres to the back surface of the light-transmissive plate 17, the distance between the opening 16b of the solar battery 16 and the unformed region 20a where the coating layer 20 is deficient is short. Accordingly, as shown in FIG. 6, if the shapes of the unformed region 20a and the opening 16b are almost the same, the periphery of the opting 16b formed in the solar battery 16 cannot readily be visibly recognized even when the date indication is viewed from an obliquely upper position, and therefore, the appearance around the date window A can be satisfactory.

Figure 8:
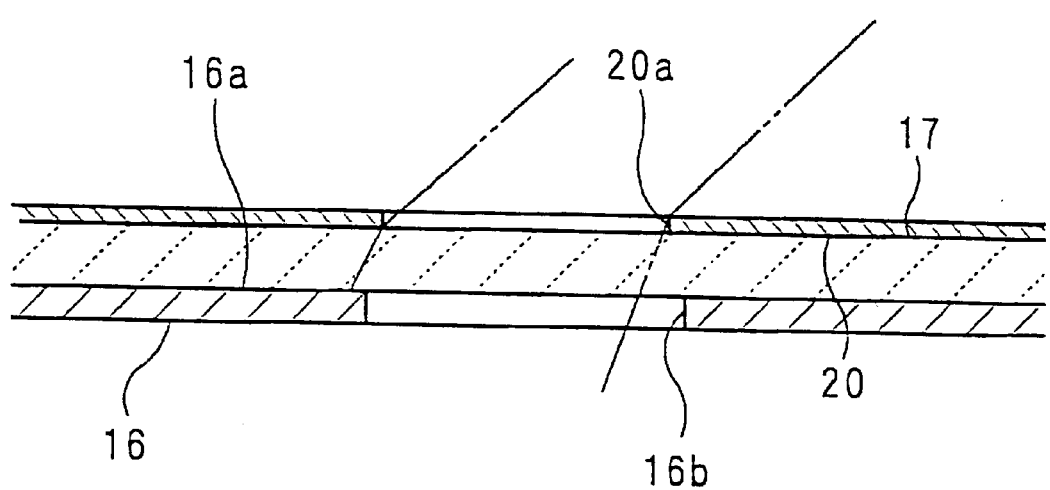
FIG. 8 is a sectional view illustrating the structure around the date window and the visibility in a comparative example in which a coating layer is formed on the front surface of a light-transmissive plate.

In contrast, as shown in FIG. 8, when the coating layer 20 is formed, for example, on the front surface of the light-transmissive plate 17, the distance between the light-receiving surface 16a of the solar battery 16 and the coating layer 20 is longer at least than the thickness of the light-transmissive plate 17. As a result, when the date indication is viewed from an obliquely upper position as described above, the periphery of the opening 16b in the underlying solar battery 16 can be widely and visibly recognized, or the date indication is hidden by the periphery of the unformed region 20a in the coating layer 20. Due to such problems, the appearance is remarkably damaged.

Incidentally, the structure of the above-described date window A is not limited to date indication, and can also be used for various windows displaying additional information such as the days.

Figure 2:
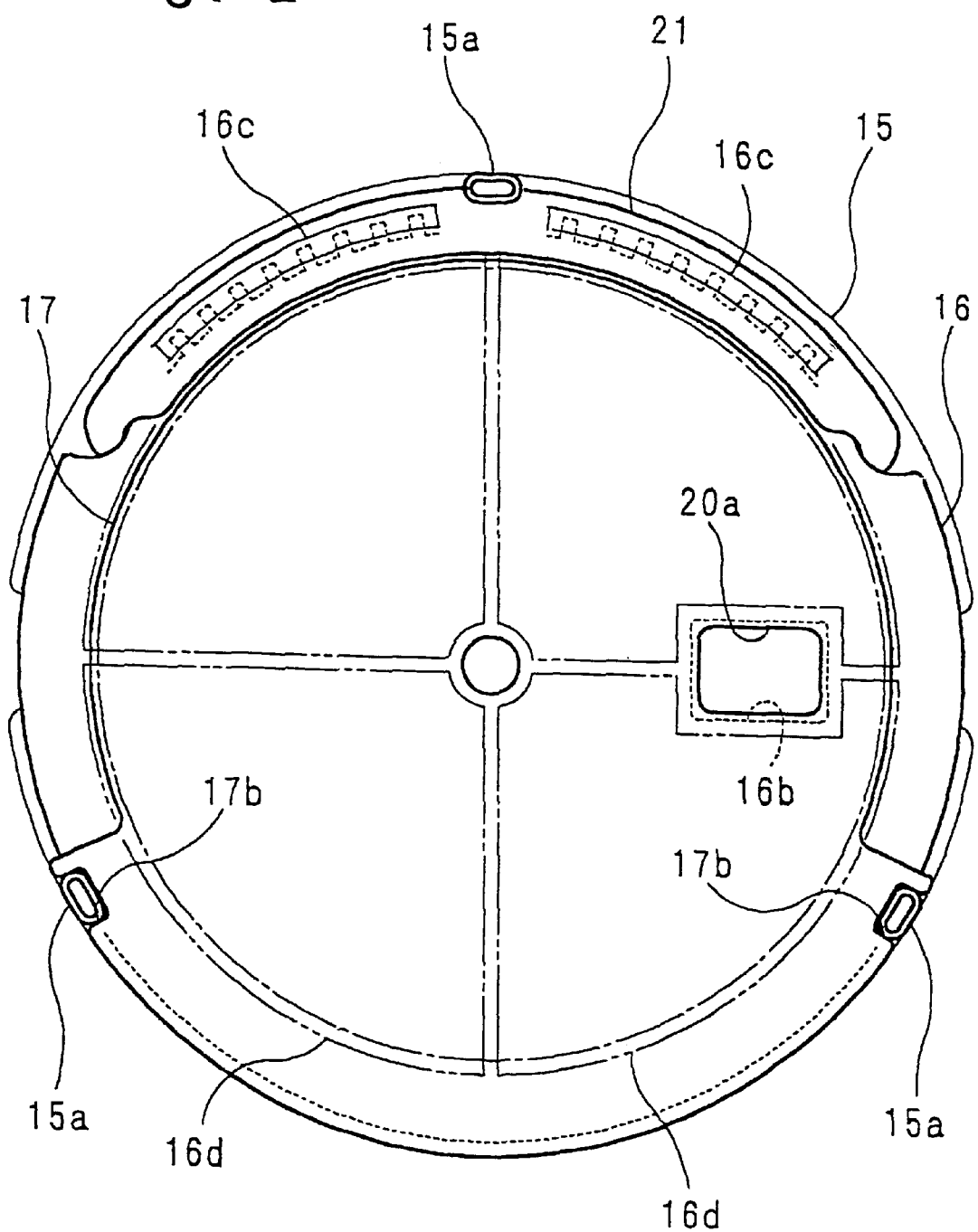
FIG. 2 is a plan view showing the planar structure of the display structure in a first embodiment.
Figure 3:
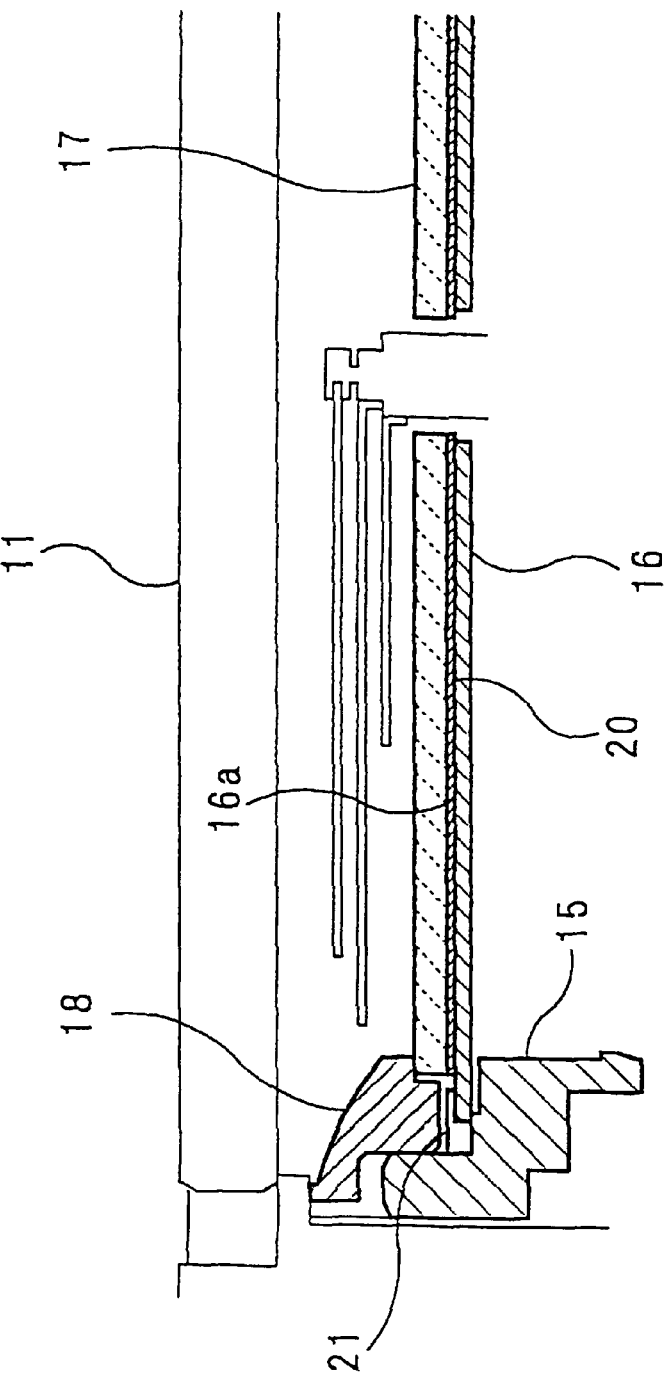
FIG. 3 is a sectional view of the first embodiment in the direction of 12 o'clock.

FIG. 2 is a plan view of the above-described embodiment when the dial holding ring 15, the solar battery 16 and the light-transmissive plate 17 are assembled, and FIG. 3 is a sectional view of the above-described embodiment in the direction of 12 o'clock. A flexible substrate 21 is disposed on the front surface at the 12 o'clock-directional periphery of the disc-shaped solar battery 16 fitted on the front side of the dial holding ring 15, and terminal portions 16c of the solar battery 16 are conductively connected to wiring portions of the flexible substrate 21. A plurality of terminal portions 16c of the solar battery 16 are connected to four partitions 16d, respectively.

In each of the four partitions 16d of the solar battery 16, a solar battery structure is individually formed. Ordinarily, the outputs of the four partitions 16d are connected in series in order to raise the voltage generated by the solar battery 16, and electric power is supplied for a secondary battery which is contained in the watch movement 14 and comprises a high-capacitance condenser or the like.

On the front side of the solar battery 16, the light-transmissive plate 17 having the coating layer 20 on its back surface is positioned by fitting an engagement depression 17b of the plate with an engagement projection 15a of the dial holding ring 15.

In a case where the coating layer 20 adheres to the back surface of the light-transmissive-plate 17 as described above, the interface (adhering surface) between the coating layer 20 and the light-transmissive plate 17 can be even or smooth. Accordingly, scattering and reflection on the incident surface of the coating layer 20 can be reduced and the amount of light passing through the coating layer 20 can be increased, as compared to the case where the coating layer 20 adheres to the front surface of the light-transmissive plate 17 [in this case, the surface (front surface) of the coating layer 20 is microscopically uneven, and cannot be smooth unless being subjected to a treatment such as polishing]. In particular, when the above-described light-accumulating fluorescent substance is used as the material for the coating layer 20, the surface (back surface) of the coating layer 20 is uneven in accordance with the diameters of the light-accumulating particles obtained by grinding the light-accumulating fluorescent substance. Accordingly, surface scattering is enhanced in a structure where extrinsic light is incident on the surface of the coating layer 20. In contrast, in the structure of this embodiment, light is incident on the adhering surface of the coating layer 20 facing the light-transmissive plate 17, and the adhering surface is evened and smoothed by the back surface of the light-transmissive plate 17. Accordingly, scattering in the coating layer 20 can be reduced.

Figure 4:
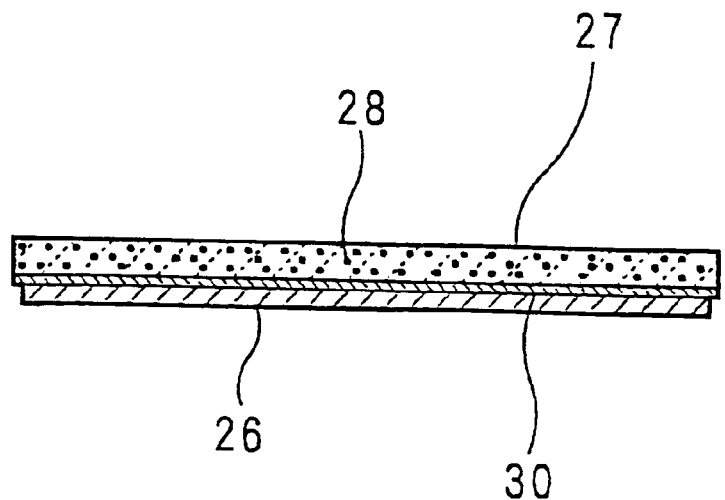
FIG. 4 is a sectional view of a display structure in which the light-transmissive plate is translucent.

FIG. 4 shows a modified embodiment based on Embodiment 1 above. In this case, a light-transmissive plate 27 having a coating layer 30 on its back surface is disposed on the front surface of a solar battery 26. The light-transmissive plate 27 comprises a transparent resin and fine non-light-transmissive particles 28 dispersed inside the resin. Due to the existence of the non-light-transmissive particles 28, the light-transmittance of the light-transmissive plate 27 is slightly lowered, the surface of the coating layer 30 can rarely be visibly recognized when viewed from the front side, and the appearance of the displaying surface can be altered. Examples of such a light-transmissive plate 27 include a plate which contains scattering particles as non-light-transmissive particles 28 and is thereby slightly opaquely white as a whole, a plate which contains highly-reflective particles as non-light-transmissive particles 28, and a plate which contains colored particles to give the entire light-transmissive plate a thin color. Incidentally, in a case where such a light-transmissive plate 27 is used, since the light-transmittance of the light-transmissive plate 27 is ordinarily lowered, the light-transmissive plate 27 should be formed so as to be thin, or the thickness of the coating layer 30 should be thin.

Figure 5:
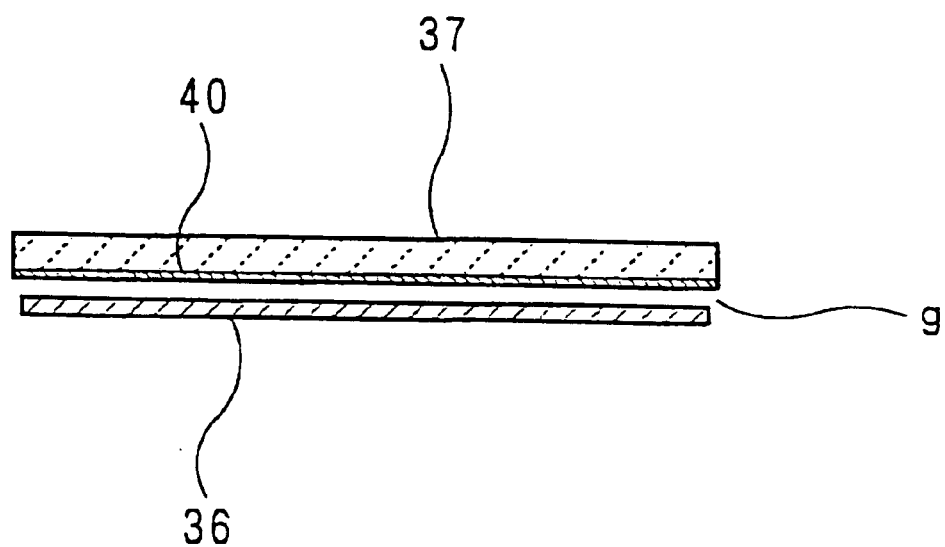
FIG. 5 is a sectional view of a structure in which the light-receiving surface of a solar battery and a light-transmissive plate are mutually distantly disposed.
Figure 7:
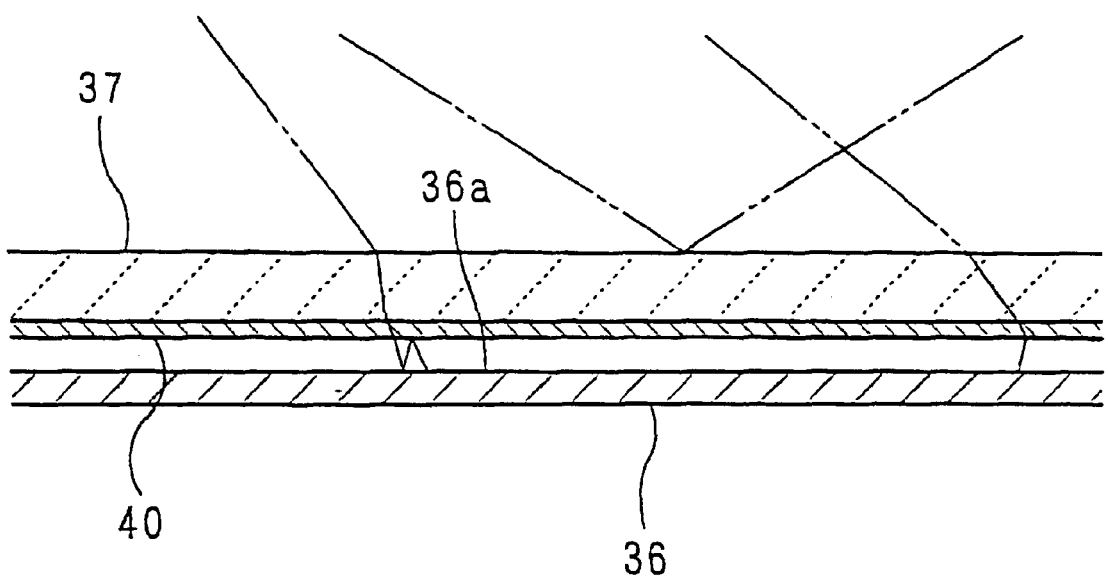
FIG. 7 is a sectional view illustrating the display structure and the visibility in the example shown in FIG. 5.

FIG. 5 shows another modified embodiment based on the above-described Embodiment 1. In this case, a non-illustrated spacer, transparent substrate or the like is partially inserted between the solar battery 36 and the light-transmissive plate 37 to detach these, and a gap g having a predetermined width is thereby formed between the light-receiving surface of the solar battery 36 and the light-transmissive plate 37. Due to the existence of the gap g, as shown in FIG. 7, even if a part of light passing through the coating layer 40 is reflected by the light-receiving surface 36a of the solar battery 36, it is irregularly reflected on the surface (back surface) of the coating layer 40, and finally, a larger part of the reflected light is returned and absorbed into the light-receiving surface 36a. As a result, the probability that light reflected on the light-receiving surface 36a is re-emitted outside is reduced. Accordingly, the efficiency of utilizing incident light can be improved. Further, since light reflected on the light-receiving surface 36a is rarely returned outside, visual recognition of the light-receiving surface 36a of the solar battery from the outside becomes difficult, and therefore, the appearance of the displaying surface can be further improved. Particularly, in a case where the above-listed light-accumulating fluorescent substance is used as the material for the coating layer 40, even if the coating layer itself absorbs light reflected on the light-receiving surface of the solar battery, the energy of absorbed light is not wasted since it is utilized as a part of afterglow energy in the coating layer.

In each of the above-described structure, regardless of the existence of a gap between the light-transmissive plate and the solar battery, the probability that the light passing through the light-transmissive plate and the coating layer and then reflected by the light-receiving surface of the solar battery is scattered on the surface of the coating layer can be increased slightly or largely if fine uneven patterns are formed on the surface (back surface) of the coating layer, or the surface of the coating layer is formed to be rough. As a result, the efficiency of utilizing light can be improved, and the appearance of the displaying surface can also be improved. In particular, in some cases where solidified fine particles such as those of the above-listed light-accumulating fluorescent substance are used as the material for the coating layer, the surface of the coating layer can be formed to be uneven in accordance with the diameters of the fine particles. In such a case, an additional treatment for making the surface of the coating layer uneven (such as an etching treatment) is not necessary.

In the above-described embodiments, if the coating layer is formed with a fluorescent material such as light-accumulating fluorescent substances, fluorescence emitted from the coating layer itself can be subjected to power generation by the solar battery. By this means, the efficiency of utilizing light in view of the entire display structure can be improved.

In any of the above-described embodiments, the light-transmissive plate covers and protects the coating layer and the solar battery, and therefore, durability of the inner structure can be improved. Particularly, since an opening may not necessarily be formed in the light-transmissive plate even when a displaying window such as a date window is formed, the inner structure can securely be protected.

Figure 9:
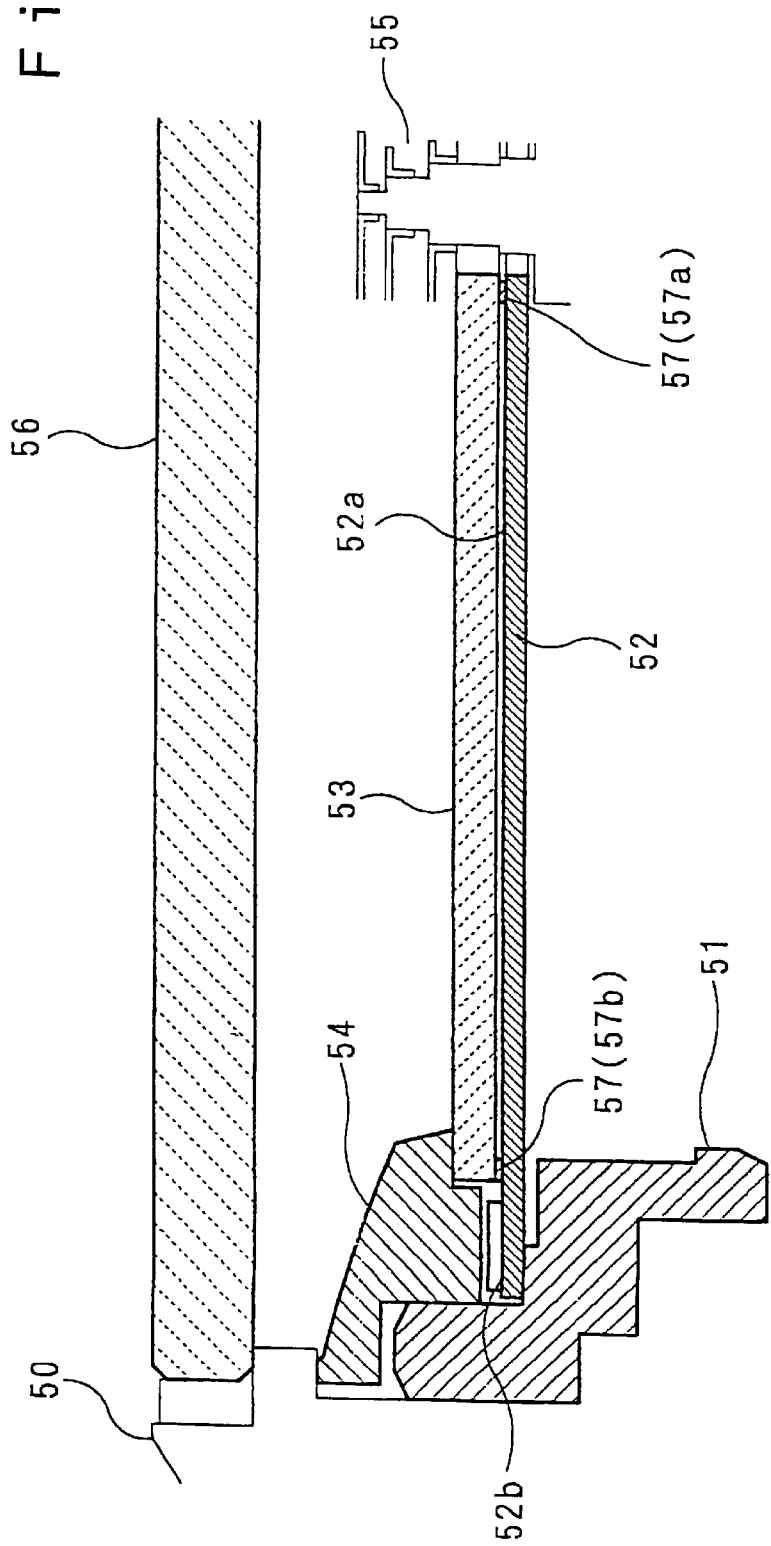
FIG. 9 is an enlarged sectional view of the solar-battery-mounted watch of a second embodiment according to the present invention.

Next, Embodiment 2 according to the present invention will be illustrated. This embodiment relates to an electronic watch, and FIG. 9 is an enlarged longitudinal-sectional view showing a part of this embodiment. In the watch, a substantially disc-shaped solar battery 52 is mounted on a dial holding ring 51 which is made of a synthetic resin and fixed to a body case (trunk) 50.

Figure 10:
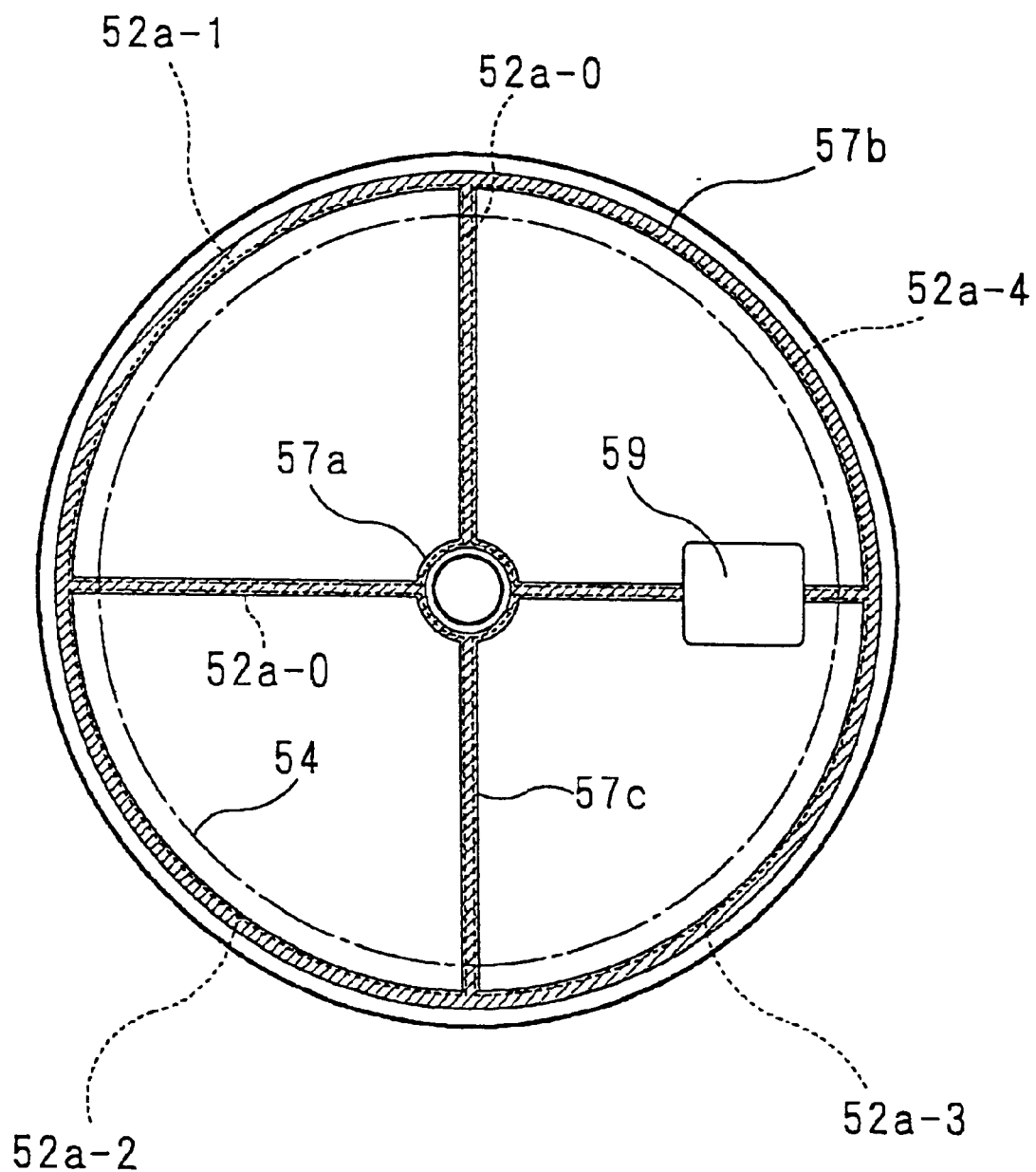
FIG. 10 is a plan view showing the planar pattern of the coating layer in the second embodiment.

The front surface (upper surface) of the solar battery 52 includes a light-receiving surface 52a, and as shown in FIG. 10, the light-receiving surface 52a comprises four partitions 52a-1, 52a-2, 52a-3 and 52a-4 formed on a silicon substrate, and gapping portions 52a-0 formed between these partitions. Similar to Embodiment 1, in the solar battery 52, photoelectric currents respectively generated from the partitions are converted into voltages through current-voltage conversion, and the voltages are connected in series between the partitions to obtain a high voltage.

In a peripheral portion of the solar battery 52, a terminal array portion 52b is formed as shown in FIG. 9, which has external terminals connected to the partitions, respectively. The solar battery 52 is connected through the terminal array portion 52b to an electric circuit formed in the watch.

The solar battery 52 and the light-transmissive plate 53 are disposed one upon another, and the periphery of the light-transmissive plate 53 is pressed by a dial ring 54 from above. Incidentally, 55 indicates a hands/wheels portion, and 56 indicates a cover glass.

The light-transmissive plate 53 may be formed with a transparent substrate made of a synthetic resin or glass, similar to Embodiment 1 above, or with a translucent plate or the like having a white color or the like. Incidentally, when the light-transmissive plate 53 is formed with a translucent plate, the transmittance of the plate should be controlled such that the power generation efficiency of the solar battery 12 falls within a range for satisfactory driving the watch mechanics. Such a light-transmissive plate 53 may be formed with a plate in which the transmittance of its material is controlled and/or its thickness is predetermined for controlling the transmittance. Alternatively, it may comprise a transparent substrate and a translucent layer on the front and/or back surfaces of the substrate, wherein the material and/or thickness of the layer is appropriately determined considering the transmittance.

On the back surface of the light-transmissive plate 53, a coating layer 57 having a predetermined thickness is formed so as to partially adhere to the surface. Preferably, the coating layer 57 is selectively formed on the back surface of the light-transmissive plate 57 by printing such as screen printing or pad printing. The coating layer 57 may be formed by vapor deposition or sputtering, or by transferring a transfer sheet to the back surface of the light-transmissive plate 57, the transfer sheet including metal foil stuck and etched into a desired shape.

The coating layer 57 should be sufficiently thicker than the wavelengths of the light beams in the visible region, though the color, the transmittance and others are not limited. Incidentally, in a case where the coating layer 57 itself is formed as a transparent layer, the power generation efficiency of the solar battery 52 is not lowered even if the layer is formed in an optional position of an optional area on the time-displaying surface.

Ordinarily, the light-receiving surface 52a of the solar battery 52 is divided into a plurality of partitions as shown in FIG. 10 in order to raise the generated voltage, and gapping portions which have a light color tone and the shape of a strip are formed between the partitions. Forming a coating layer 57 along the gapping portions with substantially the same color tone as that of the partitions is remarkably effective in making the gapping portion visibly unrecognizable. In this case, the coating layer 57 improves the appearance of the time-displaying surface, and does not affect the power generation efficiency of the solar battery 52 since the layer is formed only on the regions above the gapping portions.

In this embodiment, the solar battery 52 and the light-transmissive plate 53 are in contact to each other. Hereupon, since the coating layer 57 adhering to the back surface of the light-transmissive plate 53 provides a gap between the light-receiving surface 52a of the solar battery 52 and the back surface of the light-transmissive plate 53, generation of interference fringes between the light-transmissive plate 53 and the light-receiving surface 52a of the solar battery 52 can be prevented. The thickness of the coating layer 57 roughly determines the distance between the light-receiving surface 52a of the solar battery 52 and the back surface of the light-transmissive plate 53, and should be sufficiently thick such that the distance do not generate interference fringes in the visible region.

Such a gap should also be specified considering warp or distortion on the light-receiving surface 52a of the solar battery 52 and the back surface of the light-transmissive plate 53. The coating layer 57 should preferably be as thick as approximately 10 to 20 $\mu$m in consideration of such warp, distortion, and evenness of other parts. According to printing such as screen printing or pad printing, a coating layer having a thickness of approximately 3 to 30 $\mu$m can readily be formed.

The coating layer 57 also serves as a buffering layer between the solar battery 52 and the light-transmissive plate 53 which are directly lapped one upon another. Particularly, a thicker coating layer formed by printing exhibits a sufficient buffering effect between both the battery and the plate, and they securely adhere to each other through the coating layer. Due to this, each part can be securely fixed with presser members such as the dial ring.

FIG. 10 schematically shows the planar pattern of the coating layer 57 in this embodiment. The coating layer 57 includes a substantially-circular inner periphery portion 57a formed along the periphery of a hands/wheels-through-hole which is bored through the solar battery 52 and the light-transmissive plate 53 so as to correspond to the hands/wheels portion 55 shown in FIG. 9, and a substantially-circular outer periphery portion 57b formed along the outer peripheries of the solar battery 52 and the light-transmissive plate 53. Further, strip-shaped connecting portions 57c are included, which connect the inner periphery portion 57a and the outer periphery portion 57b, and are radially extended above the four gapping portions 52a-0 respectively formed between the four partitions 52a-1, 52a-2, 52a-3 and 52a-4 of the solar battery 52.

Although the inner periphery portion 57a and the connecting portions 57c are visibly recognizable in their original shapes even after the completion of the watch, they are especially effective in making the gapping portions 52a-0 visibly unrecognizable, the gapping portions reflecting the shapes of the light-receiving region on the light-receiving surface 52a of the underlying solar battery 52. In this case, if the coating layer 57 is made so as to exhibit a color tone similar to that of the partitions 52a-1, 52a-2, 52a-3 and 52a-4 of the solar battery 52, the planar structure of the solar battery 52 can be visibly unrecognizable from the outside. The coating layer 57 is formed on the back surface of the light-transmissive plate 53. Accordingly, the coating layer 57 having a color tone similar to that of the partitions is in contact with the partitions of the solar battery 52, namely, they are present on substantially the same plane, and therefore, they essentially cannot be visibly distinguished from each other.

The coating layer 57 is formed in order to decorate the time-displaying surface and specify its appearance, as the above-described connecting portions 57c. Preferably, the coating layer should be formed also at the peripheries of the solar battery 52 and the light-transmissive plate 53. By forming the coating layer 57 at such peripheries, the light-receiving surface 52a of the solar battery 52 which is in direct contact with the layer can be stably pressed down. In FIG. 10, the alternate long-and-short-dash line indicates the internal periphery of the dial ring 54 which presses down the periphery of the light-transmissive plate 53. If the outer periphery portion 57b is formed in a region corresponding to the portion pressed by the dial ring 54, a space can be secured between the light-receiving surface 52a of the solar battery 52 and the back surface of the light-transmissive plate 53.

In this embodiment, the light-transmissive plate 53 is held between the solar battery 52 and the dial ring 54, and the solar battery 52 is fixed to the dial holding ring 51. Alternatively, the light-transmissive plate 53 and the solar battery 52 may be sandwiched between the dial holding ring 51 and the dial ring 54. In such a structure, if at least a part of the coating layer 57 is formed in the sandwiched portion like the above-described outer periphery portion 57b, a gap can be securely provided between the light-receiving surface 52a of the solar battery 52 and the light-transmissive plate 53.

Figure 11:
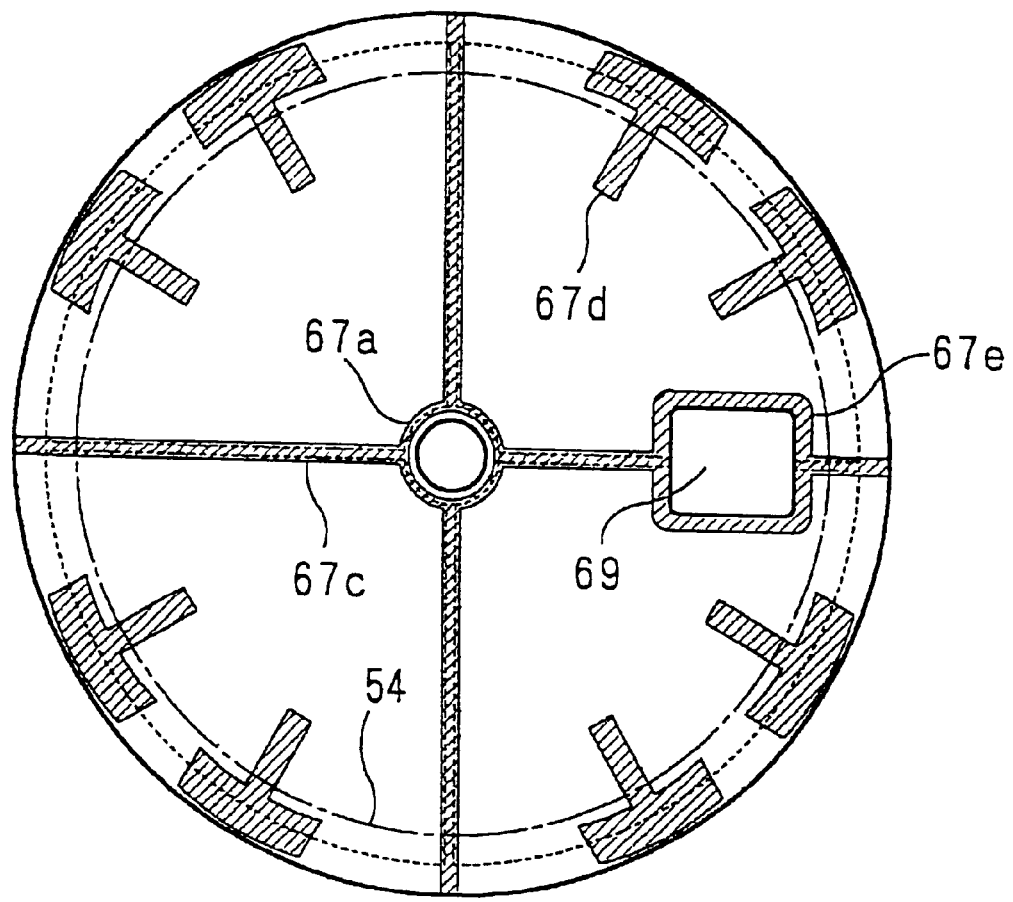
FIG. 11 is a plan view showing the pattern of the coating layer in a third embodiment which has a planar pattern different from that in Embodiment 2.
Figure 12:
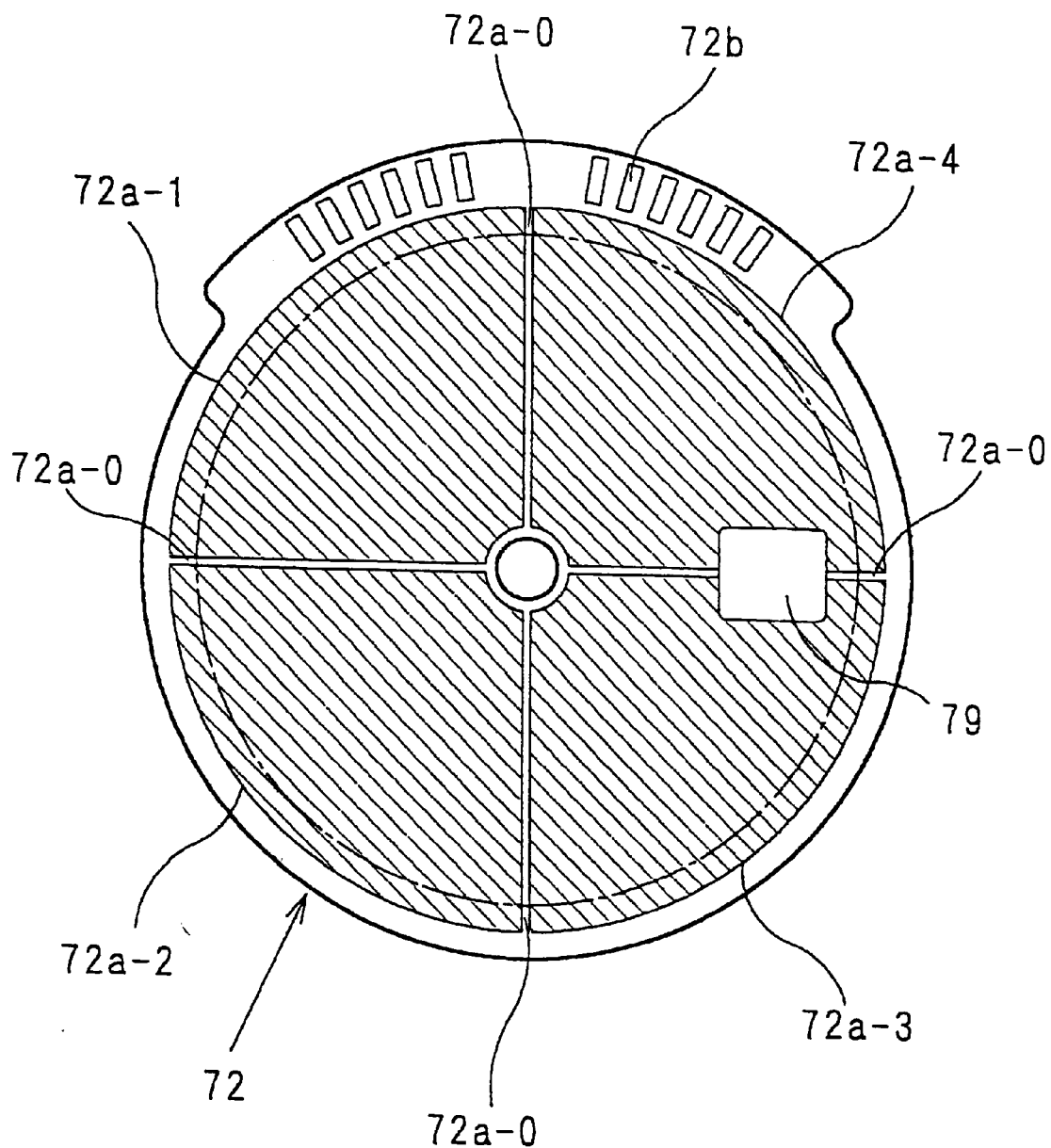
FIG. 12 is a plan view showing the planar structure of a solar battery.
Figure 13:
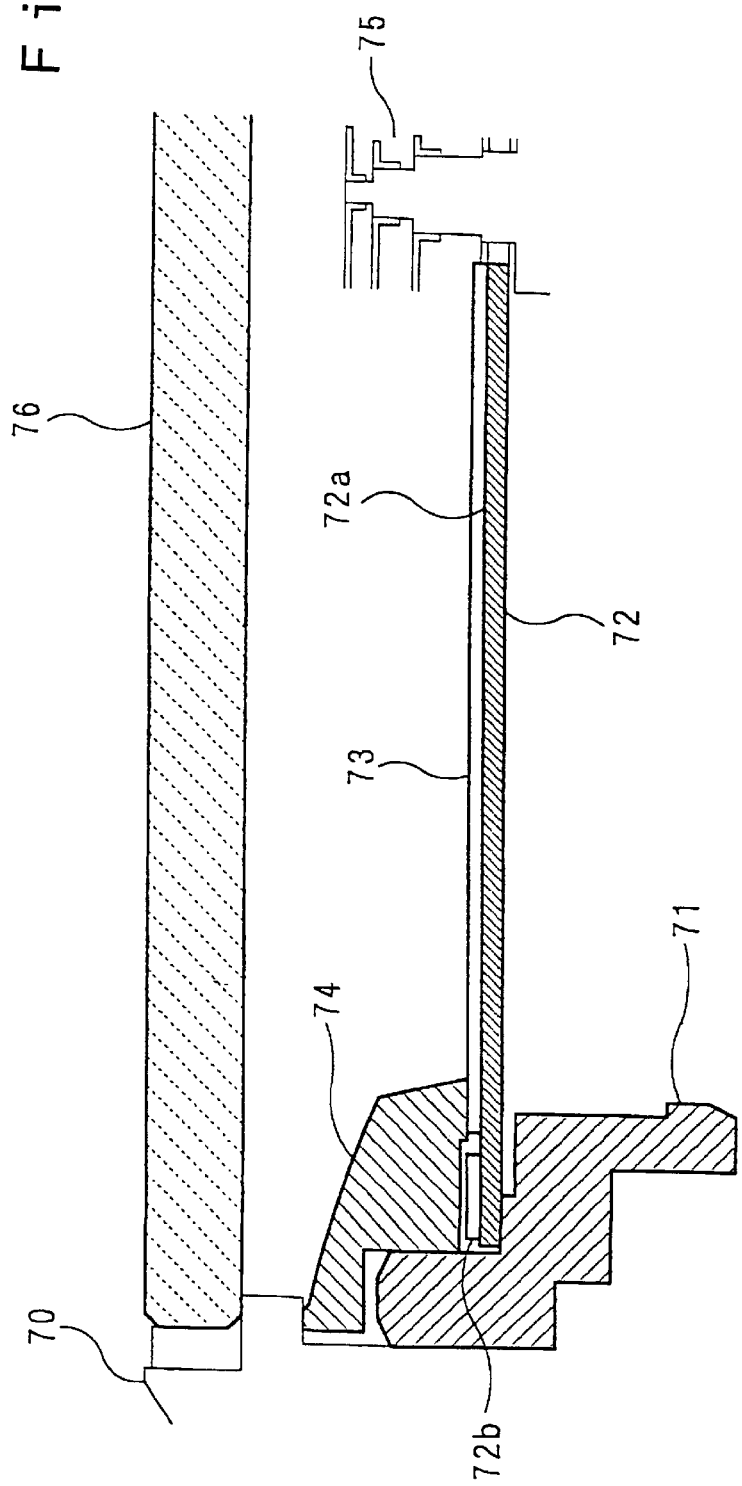
FIG. 13 is an enlarged partial sectional view showing a sectional structure of a conventional solar-battery-mounted watch.

FIG. 11 shows the planar pattern of Embodiment 3 in which a coating layer 67 having a pattern different from the above is formed on a light-transmissive plate. The coating layer 67 includes an inner periphery portion 67a and connecting portions 67c which have patterns substantially similar to those in the aforementioned coating layer 57, and further includes time-scale portions 67d for time indication by the hands and a window frame portion 67e with which a calendar window 69 is rimmed. As described above, the coating layer 67 can be formed as a part of signs or designs necessarily formed on the displaying surface. For example, the numbers for time indication, characters for displaying manufacturer names, brands, product names and others, and various figures can be formed with the planar pattern of the coating layer 67.

Incidentally, in a case where the formed coating layer also provides signs or designs, if the coating layer is formed with publicly-known various fluorescent or light-accumulating materials, the signs or designs can be made visibly recognizable even at night.

In this embodiment, since the coating layer is disposed between the light-receiving surface of the solar battery and the back surface of the light-transmissive plate, interference-fringe generation due to light-interference between the light-receiving surface and he light-transmissive plate can be prevented. Further, the coating layer itself can stabilize the lamination structure comprising the light-receiving surface and the light-transmissive plate, can be used as a means to hide the structure of the light-receiving portion in the solar battery, and can provide various characters, figures and designs on the time-indicating surface which constitutes a conventional dial.

Moreover, in each of the above-described embodiments, the light-transmissive plate can be disposed directly on the light-receiving surface of the solar battery, and therefore, a holding structure providing a space therebetween is not required. Accordingly, the part structures can be simplified and the watch can be readily assembled, and therefore, manufacturing costs can be saved. Additionally, since the coating layer is formed on the back surface of the light-transmissive plate, the above-described advantages concerning optical properties can be obtained. Further, even if the coating layer has a defect, exchanging only the light-transmissive plate, which is relatively inexpensive, can be a remedy for it, and the disposal of the expensive solar battery is not required.

The effect upon design is most remarkable among the principal effects provided by the coating layer. In addition, the coating layer has an effect of obscuring damages, scuffs and others on the displaying surface structure. In order to enhance such an effect, the coating layer should preferably be formed with a color having a lightness as high as possible, such as white. Further, when the coating layer is formed on the back surface of the light-transmissive plate, damage generation due to contact between the solar battery and the light-transmissive plate can be prevented. In addition, even if the surface (back surface) of the coating layer or the light-receiving surface of the solar battery is damaged or stained, such damages or stains can rarely be viewed from the front side.

Incidentally, although a coating layer having a uniform color tone, being uniform in thickness and comprising a single material is formed on the back surface of the light-transmissive plate in each of the above-described embodiments, a coating layer having a plurality of color tones, being ununiform in thickness and/or comprising a plurality of materials is also possible in the present invention, and it can be formed on the back surface of the light-transmissive plate with various planar distributions or patterns. With such a planar distribution or pattern of the coating layer, the planar structure of the light-receiving surface of the solar battery behind the coating layer can be visibly negated, and an expression comprising various decorative designs, characters and others can be formed on the displaying surface.

Industrial Applicability

As illustrated above, according to the present invention, since a coating layer is formed on the back surface of the light-transmissive plate, no coating layer is necessary on the light-receiving surface of the solar battery. Due to this, consideration of suitability of such a coating layer to the light-receiving surface is not required, and discarding or exchange of the solar battery due to defects in such a coating layer is not required.

Further, the appearance of the light-transmissive plate, such as the color tone, the pattern and characters can be arranged according to the combination of the plate and the coating layer, and the degree of freedom in selection of the material and thickness of the light-transmissive plate can be improved by adjusting the area, the thickness and the like of the coating layer.

Moreover, since the coating layer is formed on the back surface of the light-transmissive plate, the incident plane of extrinsic light equals the adhering surface of the coating layer onto the light-transmissive plate. Since the adhering surface can be readily smoothed by the back surface of the light-transmissive plate, the amount of reflected light or scattered light derived from extrinsic incident light can be reduced, and therefore, the efficiency of utilizing extrinsic light can be improved.

In addition, generation of interference fringes (Newton rings) between the light-transmissive plate and the light-receiving surface of the solar battery can be prevented by the coating layer formed on the back surface of the light-transmissive plate.

Furthermore, since the light-receiving surface and the back surface of the light-transmissive plate can be fixed in a state where these are directly laminated, the part structures can be simplified, assembly can be made easy, and therefore, manufacturing costs can be reduced. Additionally, if the light-transmissive plate is put into direct contact with the light-receiving surface of the solar battery, the back surface of the light-transmissive plate and the light-receiving surface of the solar battery are rarely damaged due to the coating layer formed as a buffering layer. Moreover, even if the surface of the coating layer or the light-receiving surface of the solar battery is damaged or stained, such damages or stains can rarely be seen from the front side.

What is claimed is:

1. A solar-battery-mounted display structure, comprising:
   a displaying portion having a front side facing a front direction and a rear side facing rear direction;
   a solar battery, said solar battery having a light-receiving surface disposed in the displaying portion, the light receiving surface facing the front direction;

a light-transmissive plate having a predetermined light-transmittance, the light-transmissive plate having a front facing surface and a rear facing surface and being disposed on a front side of said light-receiving surface, the rear facing surface of the light-transmissive plate having a smooth surface;

a light-transmissive coating layer formed only on the rear facing surface of said light-transmissive plate, said surface facing said light-receiving surface of the solar battery, said coating layer formed with a material including a light-emitting substance and the surface of the coating layer facing the light-transmissive plate being smooth, wherein said light-transmissive plate and said coating layer are formed to transmit sufficient light to provide at least a predetermined power-generating capacity of said solar battery.

2. The solar-battery-mounted display structure according to claim 1, wherein said coating layer is formed with a thickness of approximately 80 to 150 micrometers.

3. The solar-battery-mounted display structure according to claim 2, wherein said coating layer is formed by depositing fine particles of said light-emitting substance on said light transmissive plate.

4. The solar-battery-mounted display structure according to claim 2, further comprising a gap provided between said light-transmissive plate and said light-receiving surface of said solar battery.

5. The solar-battery-mounted display structure according to claim 2, wherein the rear facing surface of said coating layer has a rough surface.

6. The solar-battery-mounted display structure according to claim 2, further comprising a displaying window, said displaying window including a coating-layer-unformed area in said light-transmissive plate and an opening formed in the solar battery in a position corresponding to the position of said displaying window so that structure behind said opening can be visibly recognized through said displaying window.

7. The solar-battery-mounted display structure according to claim 2, wherein said coating layer is formed with a selective planar pattern on the back surface of said light-transmissive plate.

8. The solar-battery-mounted display structure according to claim 6, wherein said coating layer is thicker than the wavelengths of visible light beams, and said coating layer contacts said light-receiving surface of said solar battery to form a gap at said coating-layer-unformed area having a thickness substantially equal to said coating layer.

9. The solar-battery-mounted display structure according to claim 2, wherein said coating layer is formed in a region corresponding to the position where at least one of said solar battery and said light-transmissive plate is press-fixed with other members.

10. The solar-battery-mounted display structure according to claim 7, wherein said coating layer is formed in a region corresponding to the position where at least one of said solar battery and said light-transmissive plate is press-fixed with other members.

11. The solar-battery-mounted display structure according to claim 1, wherein said coating layer has a color distribution adapted to negate the visible planar pattern on said light-receiving surface of said solar battery.

12. The solar-battery-mounted display structure according to claim 1, wherein said coating layer has a thickness distribution adapted to negate the visible planar pattern on said light-receiving surface of said solar battery.

13. The solar-battery-mounted display structure according to claim 1, wherein said coating layer has a planar pattern adapted to negate the visible planar pattern on said light-receiving surface of said solar battery.

14. The solar-battery-mounted display structure according to claim 7, wherein said coating layer has a color distribution adapted to negate the visible planar pattern on said light-receiving surface of said solar battery.

15. The solar-battery-mounted display structure according to claim 7, wherein said coating layer has a thickness distribution adapted to negate the visible planar pattern on said light-receiving surface of said solar battery.

16. The solar-battery-mounted display structure according to claim 7, wherein said coating layer has a planar pattern adapted to negate the visible planar pattern on said light-receiving surface of said solar battery.

17. A solar-battery-mounted electronic apparatus powered by electric power comprising:

a solar-battery-mounted display structure having a front facing surface and a rear facing surface, the display structure including a displaying portion; a solar battery, said solar battery having a front facing light-receiving surface disposed in the displaying portion; a light-transmissive plate, said light transmissive plate having front and rear facing sides and having a predetermined light-transmittance and the rear facing side thereof is disposed facing a front facing side of said light-receiving surface the rear facing side having a smooth surface; and a light-transmissive coating layer formed only on the rear facing surface of said light-transmissive plate, said surface facing said light-receiving surface, said coating layer formed with a material including a light-emitting substance and the surface of the coating layer facing the light-transmissive plate having a smooth surface, wherein said light-transmissive plate and said coating layer are formed to transmit sufficient light to provide at least a predetermined power-generating capacity of said solar battery; and wherein said solar battery generates electric power for powering said electronic apparatus, said electronic apparatus receiving at least a portion of its electric power from said solar battery.

18. The solar-battery-mounted electronic apparatus according to claim 17, wherein said coating layer is formed with a thickness of approximately 80 to 150 micrometers.

19. The solar-battery-mounted electronic apparatus according to claim 18, said apparatus comprising a displaying window, said displaying window including a coating-layer-unformed area in said light-transmissive plate, an opening formed in said solar battery in a position corresponding to the displaying window, and an information-displaying portion disposed behind said opening such that said information-displaying portion can be visibly recognized through said displaying window.

20. A solar-battery-mounted watch powered by electric power comprising:

a solar-battery-mounted display structure having a front facing surface and a rear facing surface including:
a displaying portion;
a solar battery, said solar battery having a front facing light-receiving surface disposed in the displaying portion;
a light-transmissive plate having front and rear facing sides, said light transmissive plate having a predetermined light-transmittance and is disposed on a front facing side of said light-receiving surface, the rear facing side of the light-transmissive plate having a smooth surface; and a light-transmissive coating layer formed only on a rear facing surface of said light-transmissive plate, said rear facing surface facing said light-receiving surface, said coating layer formed with a material including a light-emitting substance and the surface of the coating layer facing the light-transmissive plate having a smooth surface, wherein said light-transmissive plate and said coating layer are formed to transmit sufficient light to provide at least a predetermined power-generating capacity of said solar battery; and wherein said solar battery generates electric power for powering said watch, said watch receiving at least a portion of its electric power from said solar battery.

21. The solar-battery-mounted watch according to claim 20, wherein said coating layer is formed with a thickness of approximately 80 to 150 micrometers.

22. The solar-battery-mounted watch according to claim 21, wherein said watch further comprises a displaying window, said displaying window including a coating-layer-unformed area in said light-transmissive plate and an opening formed in said solar battery in a position corresponding to the displaying window so that an information-displaying portion disposed behind said opening can be visibly recognized through said displaying window.

23. The solar-battery-mounted watch according to claim 20, wherein time-indicating patterns or characters on said displaying surface are formed according to a color distribution of said coating layer.

24. The solar-battery-mounted watch according to claim 20, wherein time-indicating patterns or characters on said displaying surface are formed according to a thickness distribution of said coating layer.

25. The solar-battery-mounted watch according to claim 20, wherein time-indicating patterns or characters on said displaying surface are formed according to a planar pattern of said coating layer.

* * * * *